(12) United States Patent
Yao et al.

(10) Patent No.: US 6,232,665 B1
(45) Date of Patent: May 15, 2001

(54) SILICON-DOPED TITANIUM WETTING LAYER FOR ALUMINUM PLUG

(75) Inventors: Gongda Yao, Fremont; Peijun Ding, San Jose; Zheng Xu, Foster City; Hoa Kieu, Sunnyvale, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/328,117

(22) Filed: Jun. 8, 1999

Related U.S. Application Data

(62) Division of application No. 08/820,512, filed on Mar. 18, 1997, now Pat. No. 5,911,113.

(51) Int. Cl.⁷ .................................................. H01L 23/48
(52) U.S. Cl. ............................................................. 257/764
(58) Field of Search ..................................... 257/764, 754, 257/751, 774, 765, 766, 758, 755, 775

(56) References Cited

U.S. PATENT DOCUMENTS

| | | |
|---|---|---|
| 4,663,191 | 5/1987 | Choi et al. . |
| 5,036,382 | 7/1991 | Yamaha . |

(List continued on next page.)

OTHER PUBLICATIONS

R.K. Nahar et al., "Effect of Si on the reaction kinetics of Ti/ALSi bilayer structures," Appl. Phys. Lett. 50(3), pp. 130–131, 1987.

X. Sun et al., "Ti–Si–N diffusion barriers for Al and Cu metallizations," on pages 401 et seq. of "Advanced Metallization and Interconnect Systems for ULSI Applications," ed. R.C. Ellwanger et al., 1995.

P.R. Besser et al., "Effect of Si on TiAl₃ formation in Ti/Al alloy bilayers," Mat. Res. Soc. Symp. Proc., vol. 355, pp. 631–636, 1995.

X. Sun et al., "Reactively sputtered Ti–Si–N diffusion barriers," Conf. Proc. ULSI XI, pp. 401–408, 1996; paper originally presented at ULSI XI Conference, Oct. 3–5, 1995.

S.P. Murarka, "Silicides for VLSI Applications," Academic Press, pp. 36–43, 78–88, 115–131 (1983).

*Primary Examiner*—Roy Potter
(74) *Attorney, Agent, or Firm*—Robert J. Stern

(57) ABSTRACT

A process for fabricating metal plugs, such as aluminum plugs, in a semiconductor workpiece. The invention is suitable for filling narrow, high aspect ratio holes, and the invention minimizes the formation of TiAl₃ or other products of interdiffusion between the plug and the wetting layer. First, an optional barrier layer is created by covering the bottom of a hole with a film containing titanium nitride doped with silicon. Second, a wetting layer is created by covering the side walls of a hole with a film containing titanium doped with silicon, in a Ti:Si molar ratio greater than 1:2. Preferably, the wetting layer is created by sputter deposition using a titanium sputtering target containing 0.1% to 20% wt silicon, most preferably 5% to 10% wt silicon. Third, the hole is filled by depositing a material consisting primarily of aluminum. The hole preferably is filled by sputter deposition using an aluminum sputtering target, optionally containing dopants such as copper. To facilitate filling the hole without voids, the aluminum sputter deposition preferably is performed "warm", i.e., with the workpiece at a temperature below the melting point of aluminum but high enough to promote reflow of the deposited material. The silicon atoms in the wetting layer inhibit the titanium from reacting with the aluminum, and the wetting layer facilitates filling the hole with the aluminum material without leaving unfilled voids.

12 Claims, 1 Drawing Sheet

U.S. PATENT DOCUMENTS

| | | | |
|---|---|---|---|
| 5,043,300 | 8/1991 | Nulman | 437/200 |
| 5,108,569 | 4/1992 | Gilboa et al. | 204/192.13 |
| 5,108,951 | 4/1992 | Chen et al. | 437/187 |
| 5,171,412 | 12/1992 | Talieh et al. | 204/192.15 |
| 5,242,860 | 9/1993 | Nulman et al. | 437/190 |
| 5,250,467 | 10/1993 | Somekh et al. | 437/192 |
| 5,266,521 | 11/1993 | Lee et al. | 437/188 |
| 5,268,329 | 12/1993 | Chittipeddi et al. | |
| 5,270,254 | 12/1993 | Chen et al. | |
| 5,278,100 | 1/1994 | Doan et al. | |
| 5,328,722 | 7/1994 | Ghanayem et al. | 427/250 |
| 5,362,372 | 11/1994 | Tepman | 204/192.12 |
| 5,371,042 | 12/1994 | Ong | 437/194 |
| 5,378,660 | 1/1995 | Ngan et al. | 437/247 |
| 5,431,799 | 7/1995 | Mosely et al. | 204/298.06 |
| 5,525,543 | 6/1996 | Chen | |
| 5,599,739 | 2/1997 | Merchant et al. | |
| 5,929,526 | * 7/1999 | Scrinivasan et al. | 257/764 |
| 6,020,642 | * 7/1999 | Drynan | 257/764 |
| 6,144,097 | * 11/2000 | Asahina et al. | 257/764 |

* cited by examiner

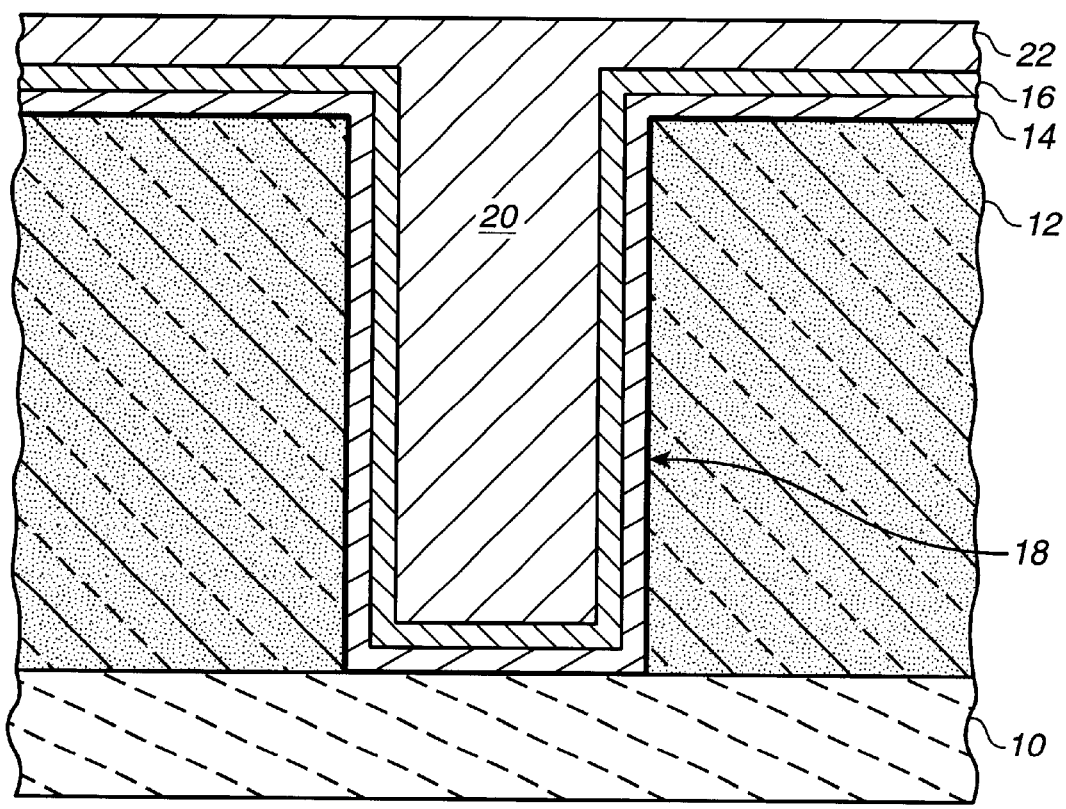

SILICON-DOPED TITANIUM WETTING LAYER FOR ALUMINUM PLUG

CROSS REFERENCE TO RELATED APPLICATIONS

This is a Divisional Application of application Ser. No. 08/820,512 filed Mar. 18, 1997, now U.S. Pat. No. 5,911,113.

FIELD OF THE INVENTION

The invention relates to sputter deposition processes for fabricating aluminum plugs which electrically connect different layers of a semiconductor integrated circuit. The invention also relates to the aluminum plugs created by such processes.

BACKGROUND OF THE INVENTION

Semiconductor integrated circuits generally have successive layers of semiconductor devices and metal conductors, each layer being separated by an intermediate dielectric layer. Electrical connections between semiconductors and/or conductors on different layers are accomplished by metal plugs which extend through the dielectric. A plug generally is fabricated by etching a hole which extends completely through a dielectric layer, and then depositing a metal so as to fill the hole.

Aluminum (optionally doped with copper) is a desirable material for plugs because of its high electrical conductivity. However, there are a number of difficulties in fabricating aluminum plugs.

One difficulty is completely filling each hole with aluminum so as to not leave any unfilled "void" within the hole, because voids increase the electrical resistance of the plug and create mechanical instability which can lead to broken connections. To maximize the density of an integrated circuit, the holes must be as narrow as possible and must have a high aspect ratio, that is, a high ratio of length to width. It is difficult to fill a narrow, high aspect ratio hole without voids.

One potential source of voids is poor adhesion between aluminum and silicon dioxide, the most commonly used dielectric, which can cause the aluminum plug to separate or "de-wet" from the side wall of the hole, thereby creating a void. A conventional solution to this problem is to deposit a wetting layer of titanium on the wall of the hole before filling the hole with aluminum. However, when depositing aluminum over titanium, the titanium and aluminum interdiffuse and react to form titanium trialuminide (TiAl$_3$), which causes a number of problems. One problem caused by the formation of TiAl$_3$ is an increase in the resistance of the aluminum plug, because TiAl$_3$ has much higher resistivity than aluminum. (P. R. Besser et al., "Effect of Si on TiAl$_3$ Formation in TiAl Alloy Bilayers," Mat. Res. Soc. Symp. Proc., vol. 355, pp. 631–636, 1995.) Another problem caused by the formation of TiAl$_3$ is the creation of voids within the plug, because TiAl$_3$ occupies less volume than the elemental titanium and aluminum consumed to produce the TiAl$_3$. (R. K. Nahar et al., "Effect of Si on the reaction kinetics of Ti/AlSi bilayer structures," Appl. Phys. Lett., vol. 50, no. 3, pp. 130–131, 1987.) A third problem is that the formation of TiAl$_3$ on the side wall of a hole narrows the aperture of the hole, and thereby impedes filling the remainder of the hole with aluminum.

One method that has been proposed for inhibiting interdiffusion between aluminum and an underlying titanium layer is to dope the aluminum with a small amount of silicon. (P. R. Besser et al., supra; and R. K. Nahar et al., supra.) However, incorporating any silicon in an aluminum plug is undesirable because conventional chemistries for etching aluminum will not react significantly with silicon, hence will leave behind unreacted silicon in the form of solid particles which can contaminate the semiconductor workpiece.

SUMMARY OF THE INVENTION

One aspect of the invention is a process for fabricating metal plugs, such as aluminum plugs, in a semiconductor workpiece. The invention is suitable for filling narrow, high aspect ratio holes, and the invention minimizes the formation of TiAl$_3$ or other reaction products arising from interdiffusion between the metal plug and the wetting layer. First, a wetting layer is created by covering the side walls of a hole with a titanium film doped with silicon. Second, the hole is filled by depositing a material consisting primarily of aluminum.

Advantageously, the silicon atoms in the wetting layer inhibit the titanium from reacting with the aluminum, and the wetting layer facilitates filling the hole with the aluminum material without leaving unfilled voids.

Preferably, the wetting layer is created by sputter deposition using a titanium sputtering target containing 0.1% to 20% wt silicon, most preferably 5% to 10% wt silicon. The hole preferably is filled by sputter deposition using an aluminum sputtering target, optionally containing dopants such as copper. To facilitate filling the hole without voids, the aluminum sputter deposition preferably is performed "hot", specifically, with the workpiece at a temperature below the melting point of aluminum but high enough to promote reflow of the deposited aluminum.

BRIEF DESCRIPTION OF THE DRAWING

The FIGURE is a sectional view of an aluminum plug fabricated according to the present invention.

DETAILED DESCRIPTION OF THE PREFERRED EMBODIMENTS

FIG. 1 shows an aluminum plug fabricated according to the present invention. A semiconductor workpiece is provided having a semiconductor or conductor feature 10 exposed by a hole etched in a layer of dielectric 12 which overlies the feature 10. When the workpiece is a silicon wafer, the feature 10 typically is a terminal of a semiconductor device and is composed of silicon. Alternatively, the feature 10 may be a contact area on a metal interconnect. The dielectric typically is silicon dioxide.

If the feature 10 is a semiconductor material, a barrier layer 14 optionally is deposited so as to cover the bottom and side wall of the hole. The material of the barrier layer should be one which inhibits diffusion of aluminum into the semiconductor 10. For example, titanium nitride is conventionally deposited as a barrier layer. The method of depositing the barrier layer can be any method capable of covering the bottom of the hole, such as a conventional reactive sputter deposition process using a mechanical collimator. Suitable processes for depositing a titanium nitride barrier layer are described in commonly-assigned U.S. Pat. No. 5,108,569 to Gilboa et al. and U.S. Pat. No. 5,371,042 to Ong, the entire contents of each of which are hereby incorporated by reference into this patent specification. Suitable sputter deposition chambers having a mechanical collimator are described in commonly-assigned U.S. Pat. No. 5,431,799 to Mosely et al., U.S. Pat. No. 5,362,372 to Tepman, and U.S. Pat. No. 5,171,412 to Talieh et al., the entire contents of each of which are hereby incorporated by reference into this patent specification. As an alternative to a non-ionized sputter chamber having a mechanical collimator, a conventional ionized sputter chamber can be used to achieve good bottom coverage without a mechanical collimator.

The wetting layer 16 then is deposited so as to cover the side wall 18 of the hole. (In addition to covering the side wall of the hole, the wetting layer typically will at least partially cover the bottom of the hole, but the bottom coverage of the wetting layer is unimportant.) In our invention, the wetting layer is a titanium film doped with silicon, in a Ti:Si atomic molar ratio greater than 1:2. The silicon concentration preferably should be low enough to prevent the formation of $TiSi_2$, because the latter compound is very brittle and would tend to flake off of the side wall. Accordingly, the silicon concentration in the titanium wetting layer 16 preferably should be in the range of about 0.1% to 20% wt, and more preferably less than 15% wt, to avoid forming $TiSi_2$. We expect the optimum concentration of silicon is in the range of about 5% to 10% wt, which corresponds to a Ti:Si atomic molar ratio in the range of about 11:1 to 5:1.

A suitable method of depositing the silicon-doped titanium wetting layer 16 is sputter deposition using a sputter target composed of a mixture of titanium and silicon in the same ratio as the ratio desired to be incorporated in the deposited film 16. Aside from the non-conventional target material, the sputtering process can be any conventional process capable of completely covering the side wall of the hole. Conventional non-ionized sputter deposition using a mechanical collimator typically can achieve good coverage of the side wall. Suitable processes for non-ionized sputter deposition of a titanium nitride barrier layer are described in U.S. Pat. No. 5,371,042 to Ong cited above. However, for holes having an aspect ratio greater than four, conventional ionized sputtering may provide better coverage of the lower portion of the side wall. Ionized sputtering generally produces vertical sputtering trajectories without requiring a collimator.

The wetting layer 16 should be deposited to a thickness great enough for the wetting layer to maintain adhesion to, and continuous coverage over, the dielectric side wall 18, even at the elevated temperature used for the subsequent aluminum deposition process described below. However, the wetting layer should be no thicker than necessary, because titanium and $TiAl_3$ are poorer electrical conductors than aluminum.

More specifically, the minimum thickness of the wetting layer 16 on the dielectric side wall 18 which will ensure adhesion of the wetting layer to the side wall is a function of the smoothness and density of the wetting layer. For example, we believe the minimum thickness of the wetting layer on the side wall should be at least 60 Å if it is deposited by non-ionized sputtering, whereas 25 Å should be sufficient if it is deposited by ionized sputtering, which typically produces a smoother, higher density film.

We define "minimum thickness" as the smallest thickness of the wetting layer at any point along the dielectric side wall 18. In either non-ionized or ionized sputter deposition, the thickness of the deposited wetting layer generally will not be uniform from the top to the bottom of the hole. Ionized sputter deposition generally produces somewhat thicker films near the bottom of the hole. Conversely, non-ionized sputter deposition produces much thicker films near the top of the hole. For example, in non-ionized sputter deposition the thickness of the wetting layer near the bottom of the side wall may be only ten percent of the thickness near the top of the side wall if the aspect ratio of the hole equals one, and it may be only three percent if the aspect ratio equals four. In the latter case, a wetting layer having a thickness of 2000 Å would have to be deposited near the top of the side wall in order to achieve a thickness of 60 Å near the bottom of the side wall.

After the wetting layer 16 is deposited, the remainder of the hole should be filled with aluminum 20. The hole can be filled using any conventional aluminum deposition process capable of filling the hole without leaving voids. A suitable process is a conventional "hot" aluminum sputter deposition, i.e., sputter deposition performed with the workpiece at a temperature below the melting point of aluminum but high enough to promote reflow of the deposited aluminum.

Suitable workpiece temperatures for reflowing aluminum are 350° C. to 550° C. At these temperatures, aluminum material 22 deposited on the surface of the dielectric adjacent the hole will flow into the hole, thereby promoting complete filling of the hole without voids. Examples of suitable "hot" aluminum sputter deposition processes are described in U.S. Pat. No. 5,371,042 to Ong and U.S. Pat. No. 5,171,412 to Talieh et al., both cited earlier in this patent specification.

The silicon atoms in the titanium wetting layer inhibit interdiffusion between the aluminum and the titanium, thereby inhibiting the formation of the undesirable compound $TiAl_3$. We theorize that the silicon inhibits such interdiffusion by occupying vacancies in the aluminum crystal structure and by occupying gaps between aluminum grain boundaries. However, our invention is not dependent on or limited by this theory.

The aluminum material 20 which fills the hole can include dopants. For example, aluminum deposited to form interconnects often is doped with copper to inhibit so-called "electromigration" (a common, but misleading, term for electron current-induced migration of aluminum atoms), which can deform the interconnects when the interconnects carry a large electrical current. One suitable method for incorporating a desired concentration of a dopant in the aluminum plug 20 is to deposit the material 20 by conventional sputter deposition using a sputtering target composed of a mixture of aluminum and the desired concentration of the dopant.

The previously described process steps of depositing a titanium nitride barrier layer 14 and then depositing a silicon-doped titanium wetting layer 16 can be performed as a single, continuous, deposition process within a single sputter deposition chamber. This is possible because the silicon-doped titanium sputtering target used for depositing the wetting layer 16 also can be used for depositing the barrier layer 14.

In this continuous, 2-step sputter deposition process, nitrogen initially is supplied to the sputter deposition chamber to react with the sputtered titanium so as to deposit a silicon-doped titanium nitride barrier 14. When the barrier layer has been deposited to the desired thickness, the flow of nitrogen is turned off, so that the silicon-doped titanium wetting layer 16 will be deposited over the barrier layer. Alternatively, instead of creating an abrupt transition from the TiN barrier layer to the Ti wetting layer, the nitrogen flow rate can be gradually decreased after the barrier layer is deposited, thereby creating a graded transition from the barrier layer to the wetting layer.

Advantageously, depositing the barrier and wetting layers in a continuous process within a single sputter deposition chamber is cost-effective because it avoids the time delays which otherwise would be required to the workpiece between two difference process chambers for depositing the two layers, including time delays for ramping the workpiece temperature up and down and pumping the vacuum in the two chambers.

Furthermore, we believe that the resulting incorporation of silicon atoms in the titanium nitride barrier layer 14 will improve the effectiveness of the barrier. Specifically, we believe the silicon atoms will occupy grain boundaries of the titanium nitride, thereby effectively increasing the grain size of the titanium nitride so as to better impede diffusion of aluminum into the barrier layer.

What is claimed is:

1. A metal plug for electrically contacting a conductor or semiconductor material on a workpiece, comprising:
    a dielectric layer overlying the conductor or semiconductor material, wherein a hole extends through the dielectric layer, whereby the hole has a dielectric side wall;
    a layer of silicon-doped titanium covering the side wall of the hole, wherein the silicon-doped titanium layer has a concentration of silicon no greater than 20% by weight; and
    a layer of said metal overlying at least a portion of the silicon-doped titanium layer.

2. A plug according to claim 1, wherein the silicon-doped titanium layer has a concentration of silicon high enough to impede the interdiffusion of said metal and the titanium.

3. A plug according to claim 1, wherein said metal is aluminum.

4. A plug according to claim 3, wherein the silicon-doped titanium layer has a concentration of silicon high enough to impede the interdiffusion of the aluminum and the titanium.

5. A plug according to claim 3, wherein the silicon-doped titanium layer has a concentration of silicon high enough to substantially prevent the formation of titanium trialuminide ($TiAl_3$) at the boundary between the titanium layer and the aluminum layer.

6. A plug according to claim 1 wherein the silicon-doped titanium layer has a concentration of silicon in the range of 0.1% to 20% wt.

7. A plug according to claim 1 wherein the silicon-doped titanium layer has a concentration of silicon in the range of 5% to 10% wt.

8. A plug according to claim 1, wherein the silicon-doped titanium layer has an atomic molar ratio of titanium to silicon of at least 5.

9. A plug according to claim 1, wherein the silicon-doped titanium layer has a concentration of silicon low enough so that substantially no $TiSi_2$ forms in the silicon-doped titanium layer.

10. A plug according to claim 1, wherein the metal layer directly overlies the silicon-doped titanium layer, with no other layer of material between the metal layer and the silicon-doped titanium layer.

11. A plug according to claim 1, wherein the metal layer completely covers the silicon-doped titanium layer.

12. A plug according to claim 1, wherein the metal layer occupies most of the volume of the hole.

* * * * *